(12) United States Patent
Gossner

(10) Patent No.: US 6,590,263 B2
(45) Date of Patent: Jul. 8, 2003

(54) ESD PROTECTION CONFIGURATION FOR SIGNAL INPUTS AND OUTPUTS IN SEMICONDUCTOR DEVICES WITH SUBSTRATE ISOLATION

(75) Inventor: Harald Gossner, Riemerling (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/100,238

(22) Filed: Mar. 18, 2002

(65) Prior Publication Data

US 2002/0121668 A1 Sep. 5, 2002

Related U.S. Application Data

(63) Continuation of application No. PCT/DE00/03252, filed on Sep. 15, 2000.

(30) Foreign Application Priority Data

Sep. 16, 1999 (DE) .......................................... 199 44 489

(51) Int. Cl.[7] .............................................. H01L 23/62

(52) U.S. Cl. ...................................... 257/355; 257/173

(58) Field of Search ................................ 257/487, 355, 257/356, 357, 358, 359, 360, 365, 173, 174

(56) References Cited

U.S. PATENT DOCUMENTS

| 5,290,724 A | 3/1994 | Leach |
| 5,361,185 A | 11/1994 | Yu |
| 5,442,217 A | 8/1995 | Mimoto |
| 6,118,155 A | * 9/2000 | Voldman ..................... 257/360 |
| 6,184,557 B1 | * 2/2001 | Poplevine et al. .......... 257/358 |

FOREIGN PATENT DOCUMENTS

JP  410084098 A  * 3/1998

* cited by examiner

Primary Examiner—Wael Fahmy, Jr.
Assistant Examiner—Dana Farahani
(74) Attorney, Agent, or Firm—Laurence A. Greenberg; Werner H. Stemer; Ralph H. Locher

(57) ABSTRACT

In the ESD protection configuration, in addition to the existing protection configurations, at each supply pad of the supply bus, an ESD diode is also inserted between the power bus with the potential VSSP and the supply bus with the supply potential VDDP. This ESD diode closes the protection path for negative loads between the substrate potential VSSB and the potential VSSP during an ESD stress and limits the voltage difference occurring between the two corresponding buses (the substrate bus and the power bus) to the terminal voltage of the breakdown diode plus the forward voltage of the ESD diode. The ESD diode between the power bus and the supply bus is intended to be operated only in the forward direction. This requires the breakdown voltage of the ESD diode to be significantly above the breakdown voltage of the breakdown diode of the supply bus.

5 Claims, 1 Drawing Sheet

ESD PROTECTION CONFIGURATION FOR SIGNAL INPUTS AND OUTPUTS IN SEMICONDUCTOR DEVICES WITH SUBSTRATE ISOLATION

CROSS-REFERENCE TO RELATED APPLICATION

This application is a continuation of copending International Application No. PCT/DE00/03252, filed Sep. 15, 2000, which designated the United States.

BACKGROUND OF THE INVENTION

Field of the Invention

The present invention relates to an ESD protection configuration (ESD=electrostatic discharge) for signal inputs and outputs (I/O) in semiconductor devices with substrate isolation. In the configuration, a semiconductor substrate is connected to a substrate bus for applying a substrate potential VSSB to the semiconductor substrate, and a semiconductor diffusion zone in the semiconductor substrate is connected to a power bus for applying a power potential VSSP to the semiconductor diffusion zone. A parasitic diode is located between the substrate bus and the power bus. A supply potential VDDP can be fed via a supply bus to the semiconductor devices that are provided with I/O pads (or input/output contact pads). A forward-biased breakdown diode is located between the substrate bus and the supply bus. The diffusion zone can be utilized as a source of drivers, for example.

As is known, ESD protection configurations are required in order to protect integrated circuits against overvoltages. Such overvoltages can occur, for example, as a result of friction when the integrated circuit is displaced, or as a result of the integrated circuit being touched by an operator ("human body model"). ESD-resistant semiconductor devices should be able to withstand voltages up to orders of magnitude of a few kilovolts and currents up to the order of magnitude of a few amps. In order to attain this ESD strength, the corresponding buses must be kept at a low impedance in order to avoid high voltage drops on the bus lines, in particular, the substrate bus with the substrate potential VSSB and the power bus with the potential VSSP. For this purpose, it is necessary, depending on the bus width and the sheet resistance of the bus, to effect bonding at defined distances from external pins (or connections). These distances may be of the order of magnitude of 1 mm.

FIG. 3 shows a prior art configuration in which a substrate bus 2 for substrate potential VSSB and a power bus 1 for the potential VSSP are provided. The substrate potential VSSB is relatively "quiet", while the potential VSSP, as a result of the switching operations of drivers, in comparison with the substrate potential VSSB, may be subject to fluctuations of hundreds of mV and can be regarded as relatively "unquiet". The substrate bus 2 is connected via a breakdown diode 4, for example a zener diode, to an I/O pad 3 in order to be able to dissipate ESD discharges onto the substrate bus 2.

In order to ensure the ESD strength, the two buses 1, 2 are bonded to an external pin 7 at regular distances via pads 5, 6. In order to simplify the illustration, FIG. 3 in each case shows only one pad 5 and 6 and one pin 7. In this case, one pad 5 and one pad 6 are in each case to be connected to a pin 7 via a double bond. In this way, the respective buses 1, 2 or the protective sections provided on the buses 1, 2 can be kept at a low impedance if the pads 5, 6 are bonded to a respective pin 7 at a distance of 1 mm, for example.

One disadvantage of this existing ESD protection configuration, however, is that a large number of corresponding pads have to be made available for bonding to the substrate bus 2, for example, which is performed at regular distances. The result is that more pins than are actually available are required for bonding to these pads.

An ESD protection configuration is thus produced in which the semiconductor devices, with respect to the lower supply potential VSS in the region of the I/O pads 3 at which the above mentioned overvoltages preferably occur, are connected, under so-called substrate isolation, both to the substrate bus 2, and by means of, for example, the source of a driver transistor, to the power bus 1. As a result, it is possible, moreover, to utilize a parasitic diode present between the semiconductor substrate and a diffusion zone, so that only one of the two buses 1, 2 need be made wider.

As an alternative, it would also be conceivable for the buses 1, 2 for the potential VSSP and the substrate potential VSSB, respectively, to be coupled to one another by pairs of back-to-back diodes. However, in the event of a positive distortion of the potential VSSP, which may occur during the switching of the drivers, this procedure with back-to-back diodes leads to a disturbance on the substrate bus 2, and thus also to disturbances to sensitive circuit sections.

SUMMARY OF THE INVENTION

It is accordingly an object of the invention to provide an ESD protection configuration which overcomes the above-mentioned disadvantages of the prior art apparatus of this general type.

In particular, it is an object of the invention to provide an ESD protection configuration in which the number of pads of the substrate bus, and thus also the number of pins for bonding to the pads can be reduced.

With the foregoing and other objects in view there is provided, in accordance with the invention, an ESD protection configuration for semiconductor devices having I/O pads and substrate isolation. The ESD protection configuration includes: a semiconductor substrate; a substrate bus connected to the semiconductor substrate for applying a substrate potential to the semiconductor substrate; a semiconductor diffusion zone formed in the semiconductor substrate; a power bus connected to the semiconductor diffusion zone for applying a power potential to the semiconductor diffusion zone; and a parasitic diode located between the substrate bus and the power bus. The parasitic diode acts in the event of a positive voltage load on the I/O pads. The ESD protection configuration also includes: a supply bus for feeding a supply potential to the semiconductor devices; and a breakdown diode located between the substrate bus and the supply bus. The breakdown diode becomes forward-biased in the event of a negative voltage load on the I/O pads. An additional ESD diode is provided between the power bus and the supply bus. The additional ESD diode becomes forward-biased in the event of the negative voltage load. The additional ESD diode has a breakdown voltage that is higher than the breakdown voltage of the breakdown diode.

In accordance with an added feature of the invention, the semiconductor device includes a driver.

In accordance with an additional feature of the invention, the driver has an NMOS transistor.

In accordance with another feature of the invention, the NMOS transistor has a source; and the parasitic diode is located between the source of the NMOS transistor and the substrate bus.

In the case of an ESD protection configuration of the type mentioned in the introduction, the object of the invention is achieved by virtue of the fact that an additional, forward-biased ESD diode is provided between the power bus and the supply bus.

In the inventive ESD protection configuration, in addition to the existing protection configurations, at each supply pad of the supply bus, an ESD diode is also inserted between the power bus with the potential VSSP and the supply bus with the supply potential VDDP. This ESD diode closes the protection path for negative loads between the substrate potential VSSB and the potential VSSP during an ESD stress and limits the voltage difference occurring between the two corresponding buses (the substrate bus and the power bus) to the terminal voltage of the breakdown diode plus the forward voltage of the ESD diode. The ESD diode between the power bus and the supply bus is intended to be operated only in the forward direction. This requires the breakdown voltage of the ESD diode to be significantly above the breakdown voltage of the breakdown diode of the supply bus.

In the event of positive loads which are presented via the substrate bus, the parasitic diode between the substrate or diffusion zone or semiconductor well and the source of an NMOS driver transistor is forward-biased and thus limits the voltage difference between the two buses (the substrate bus and the power bus) to low values, provided that the parasitic diode is embodied in a suitable manner, i.e. has a sufficient width and an electrode spacing that is optimized for ESD. For this purpose, the pads for the supply bus and the power bus and also the I/O pads are fitted in a suitable spacing grid.

Other features which are considered as characteristic for the invention are set forth in the appended claims.

Although the invention is illustrated and described herein as embodied in a ESD protection configuration for signal inputs and outputs in semiconductor devices with substrate isolation, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 2:
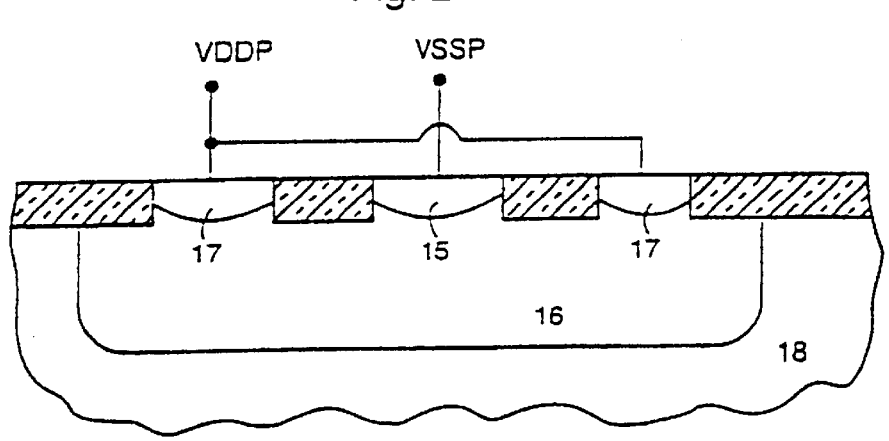
FIG. 2 is a cross-sectional view through a semiconductor device having an ESD diode of the ESD protection configuration.
Figure 3:
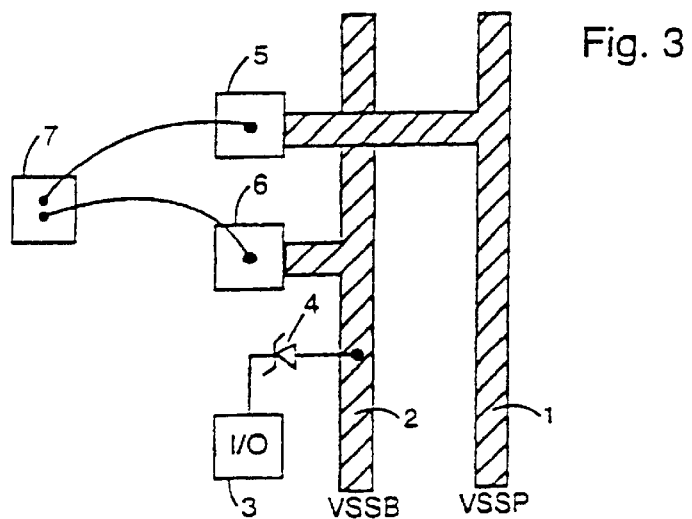
FIG. 3 is a plan view of a substrate bus and a power bus with assigned pads connected in a prior art protection configuration.

FIG. 3 has already been explained in the introduction. The same reference symbols as those used in FIG. 3 have been used for mutually corresponding structural parts in FIGS. 1 and 2.

Figure 1:
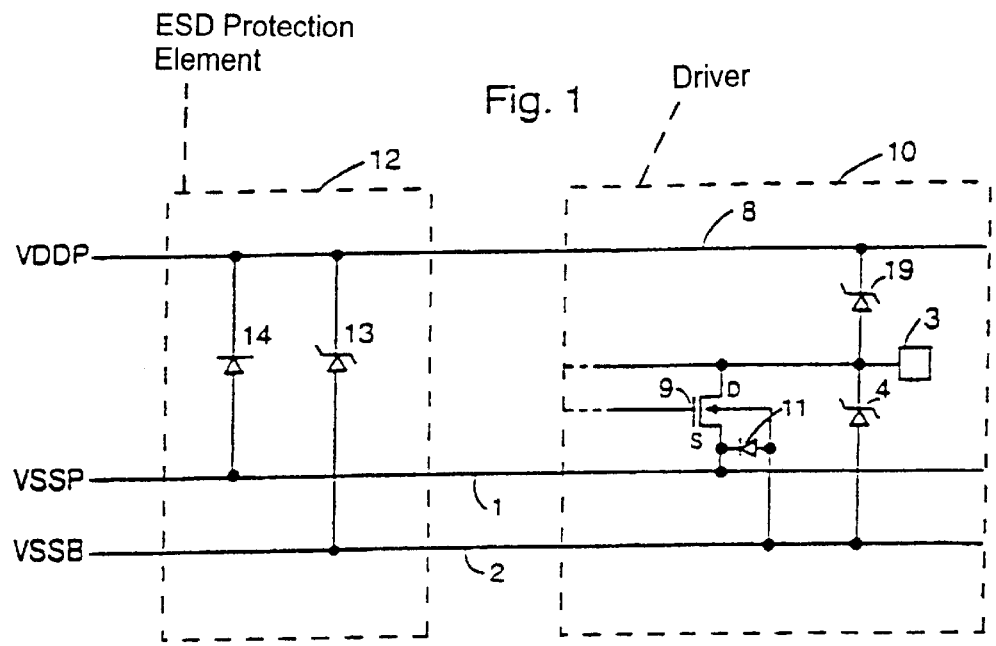
FIG. 1 shows a circuit diagram of an inventive ESD protection configuration.

Referring now to the figures of the drawing in detail and first, particularly, to FIG. 1 thereof, there is shown a power bus 1 with the potential VSSP, a substrate bus 2 with the substrate potential VSSB, and a supply bus 8 with the supply potential VDDP. The potentials VSSP and VSSB are about 0 V, while about 5 V is estimated for the supply potential VDDP.

An I/O pad 3 in a driver 10 with an NMOS transistor 9 is connected via breakdown diodes 4 and 19 such as, for example, zener diodes, to the substrate bus 2 and the supply bus 8. The I/O pad 3 is also directly connected to drain D of the NMOS transistor 9. The source S of the NMOS transistor 9 is connected to the potential VSSP and the well of the NMOS transistor 9 is connected to the substrate potential VSSB. A parasitic diode 11 is formed between the source and the well.

Each supply pad (not specifically illustrated in FIG. 1) of the supply potential VDDP is assigned an ESD protection element 12, which initially includes a breakdown diode 13, for example, a zener diode that is connected between the substrate bus 2 and the supply bus 8. Moreover, according to the invention, this ESD protection element 12 also has an additional ESD diode 14 connected between the supply bus 8 and the well bus 1.

This ESD diode 14, which may be a customary pn diode, closes the protection path for negative loads between the substrate bus 2 and the power bus 1 during an ESD stress and limits the voltage difference occurring between the two buses 1 and 2 to the terminal voltage of the breakdown diode 13 plus the forward voltage of the ESD diode 14. The ESD diode 14, which is located between the power bus 1 and the supply bus 8, is operated only in the forward direction. For this purpose, its breakdown voltage is significantly above the breakdown voltage of the breakdown diode 13 on the supply bus 8. In the event of positive loads that occur across the substrate bus 2, the parasitic diode 11 is forward-biased and thus limits the voltage difference between the two buses 1 and 2 to low values. The parasitic diode 11 is connected between the source S of the NMOS transistor 9, which is connected to the power bus 1, and the substrate bus 2.

FIG. 2 shows an exemplary embodiment for realizing the ESD diode 14 from a $p^+$-conducting region 15, at which the potential VSSP is present, and an n-conducting semiconductor well 16 with $n^+$-conducting contact regions 17 for connecting to the supply potential VDDP. The n-conducting semiconductor well 16 is in a p-conducting semiconductor substrate 18.

The inventive ESD protection configuration thus enables an advantageous embodiment of the pads 5 (cf. FIG. 3) of the power bus 1 for dissipating the ESD pulse without having to introduce a pad 6 for the substrate bus 2. This reduces the number of required pads in the "pad ring" and avoids the implementation of double bonds, which can be difficult depending on the type of housing.

I claim:

1. An ESD protection configuration for semiconductor devices having I/O pads and substrate isolation, comprising:
    a semiconductor substrate;
    a substrate bus connected to said semiconductor substrate for applying a substrate potential to said semiconductor substrate;
    a semiconductor diffusion zone formed in said semiconductor substrate;
    a power bus connected to said semiconductor diffusion zone for applying a power potential to said semiconductor diffusion zone;
    a parasitic diode connected between said substrate bus and said power bus, said parasitic diode acting in an event of a positive voltage load on the I/O pads;
    a supply bus for feeding a supply potential to the semiconductor devices; and
    a breakdown diode connected between said substrate bus and said supply bus, said breakdown diode becoming forward-biased in an event of a negative voltage load on the I/O pads, said breakdown diode having a breakdown voltage;

an additional ESD diode provided between said power bus and said supply bus;

said additional ESD diode becoming forward-biased in the event of the negative voltage load;

said additional ESD diode having a breakdown voltage being higher than said breakdown voltage of said breakdown diode.

2. The ESD protection configuration according to claim 1, wherein said semiconductor device includes a driver.

3. The ESD protection configuration according to claim 2, wherein said driver has an NMOS transistor.

4. The ESD protection configuration according to claim 3, wherein:

said NMOS transistor has a source; and said parasitic diode is connected between said source of said NMOS transistor and said substrate bus.

5. The ESD protection configuration according to claim 1, wherein said breakdown diode is connected directly between said substrate bus and said supply bus, and said additional ESD diode is connected directly between said power bus and said supply bus.

* * * * *